United States Patent
Ward et al.

(10) Patent No.: US 8,987,102 B2
(45) Date of Patent: Mar. 24, 2015

(54) METHODS OF FORMING A METAL SILICIDE REGION IN AN INTEGRATED CIRCUIT

(75) Inventors: Michael G. Ward, Niskayuna, NY (US); Igor V. Peidous, Loudonville, NY (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/547,527

(22) Filed: Jul. 12, 2012

(65) Prior Publication Data

US 2013/0026617 A1    Jan. 31, 2013

Related U.S. Application Data

(60) Provisional application No. 61/512,226, filed on Jul. 27, 2011.

(51) Int. Cl.
*H01L 21/336* (2006.01)
*H01L 21/285* (2006.01)

(52) U.S. Cl.
CPC .............................. *H01L 21/28518* (2013.01)
USPC ......................................... 438/301; 438/233

(58) Field of Classification Search
None
See application file for complete search history.

(56) References Cited

U.S. PATENT DOCUMENTS

| 5,635,746 | A  | * | 6/1997 | Kimura et al. | 257/382 |
| 6,403,472 | B1 |   | 6/2002 | Woodbury et al. | |
| 2005/0064638 | A1 |   | 3/2005 | Regnier et al. | |
| 2008/0132047 | A1 | * | 6/2008 | Dunne et al. | 438/527 |
| 2010/0164001 | A1 | * | 7/2010 | Park et al. | 257/369 |
| 2010/0237440 | A1 | * | 9/2010 | Ito | 257/408 |

OTHER PUBLICATIONS

International Search Report and Written Opinion mailed Jan. 29, 2013 for PCT Application No. PCT/US2012/047986.

* cited by examiner

*Primary Examiner* — Whitney T Moore
*Assistant Examiner* — Joseph Galvin, III
(74) *Attorney, Agent, or Firm* — Moser Taboada; Alan Taboada

(57) ABSTRACT

Methods of forming a metal silicide region in an integrated circuit are provided herein. In some embodiments, a method of forming a metal silicide region in an integrated circuit includes forming a silicide-resistive region in a first region of a substrate, the substrate having the first region and a second region, wherein a mask layer is deposited atop the substrate and patterned to expose the first region; removing the mask layer after the silicide-resistive region is formed in the first region of the substrate; depositing a metal-containing layer on a first surface of the first region and a second surface of the second region; and annealing the deposited metal-containing layer to form a first metal silicide region in the second region.

19 Claims, 5 Drawing Sheets

US 8,987,102 B2

METHODS OF FORMING A METAL SILICIDE REGION IN AN INTEGRATED CIRCUIT

CROSS-REFERENCE TO RELATED APPLICATIONS

This application claims benefit of U.S. provisional patent application Ser. No. 61/512,226, filed Jul. 27, 2011, which is herein incorporated by reference.

FIELD

Embodiments of the present invention generally relate to methods of substrate processing for integrated circuits.

BACKGROUND

Integrated circuit fabrication includes many steps, which may be complex and expensive. For example, one exemplary procedure to form a metal silicide in an integrated circuit includes providing a substrate having a first region and a second region and depositing a first patterned photoresist layer to expose the first region. The first region is doped with a dopant to control resistivity in the first region. Once doping of the first region is complete, the first patterned mask layer is removed and a second patterned mask layer is formed to expose the second region. The second patterned mask layer is a hard mask, such as silicon nitride (SiN). A metal layer, such as nickel (Ni) or the like, is deposited atop the exposed second region and is annealed to form a metal silicide in the exposed second region. Lastly, the second mask layer and any remaining non-silicided metal may be removed after the anneal is complete.

The inventors have provided improved methods to form a metal silicide in an integrated circuit.

SUMMARY

Methods of forming a metal silicide region in an integrated circuit are provided herein. In some embodiments, a method of forming a metal silicide region in an integrated circuit includes forming a silicide-resistive region in a first region of a substrate, the substrate having the first region and a second region, wherein a mask layer is deposited atop the substrate and patterned to expose the first region; removing the mask layer after the silicide-resistive region is formed in the first region of the substrate; depositing a metal-containing layer on a first surface of the first region and a second surface of the second region; and annealing the deposited metal-containing layer to form a first metal silicide region in the second region.

In some embodiments, forming the silicide-resistive region may further include controlling at least one of a concentration of a source element in the silicide-resistive region or a depth that the silicide-resistive region extends into the first region from the first surface to control the amount of metal silicide formed in the first region. In some embodiments, increasing the concentration of source element in the silicide-resistive region may reduce the size of a second metal silicide region formed in the first region. In some embodiments, increasing the depth that the silicide-resistive region extends into the first region from the first surface may reduces the size of a second metal silicide region formed in the first region. In some embodiments, no metal silicide forms in the first region upon annealing the metal-containing layer.

In some embodiments, a method of forming a metal silicide region in an integrated circuit includes providing a substrate having a first region and a second region and a mask layer deposited atop the substrate and patterned to expose the first region; doping the exposed first region with a dopant to control the resistivity of the first region; forming a silicide-resistive region in the doped first region by providing a source element to the doped first region, wherein the source element comprises at least one of carbon (C) or nitrogen (N); removing the mask layer after the silicide-resistive region is formed in the doped first region; depositing a metal-containing layer on a first surface of the doped first region and a second surface of the second region; annealing the deposited metal-containing layer to form a first metal silicide region in the second region; and removing non-silicided metal, the non-silicided metal remaining from depositing the metal-containing layer, from above the first and second regions after the first metal silicide region is formed in the second region.

In some embodiments, a semiconductor structure may be provided, for example, for use in an integrated circuit. The semiconductor structure may include a substrate; a first region disposed in the substrate, wherein the first region includes a resistivity adjusting element and a silicide-resistive element; a second region disposed in the substrate adjacent to the first region; a first metal silicide layer disposed atop the first region; and a second metal silicide layer disposed atop the second region, wherein the first metal silicide layer is thinner than the second metal silicide layer.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
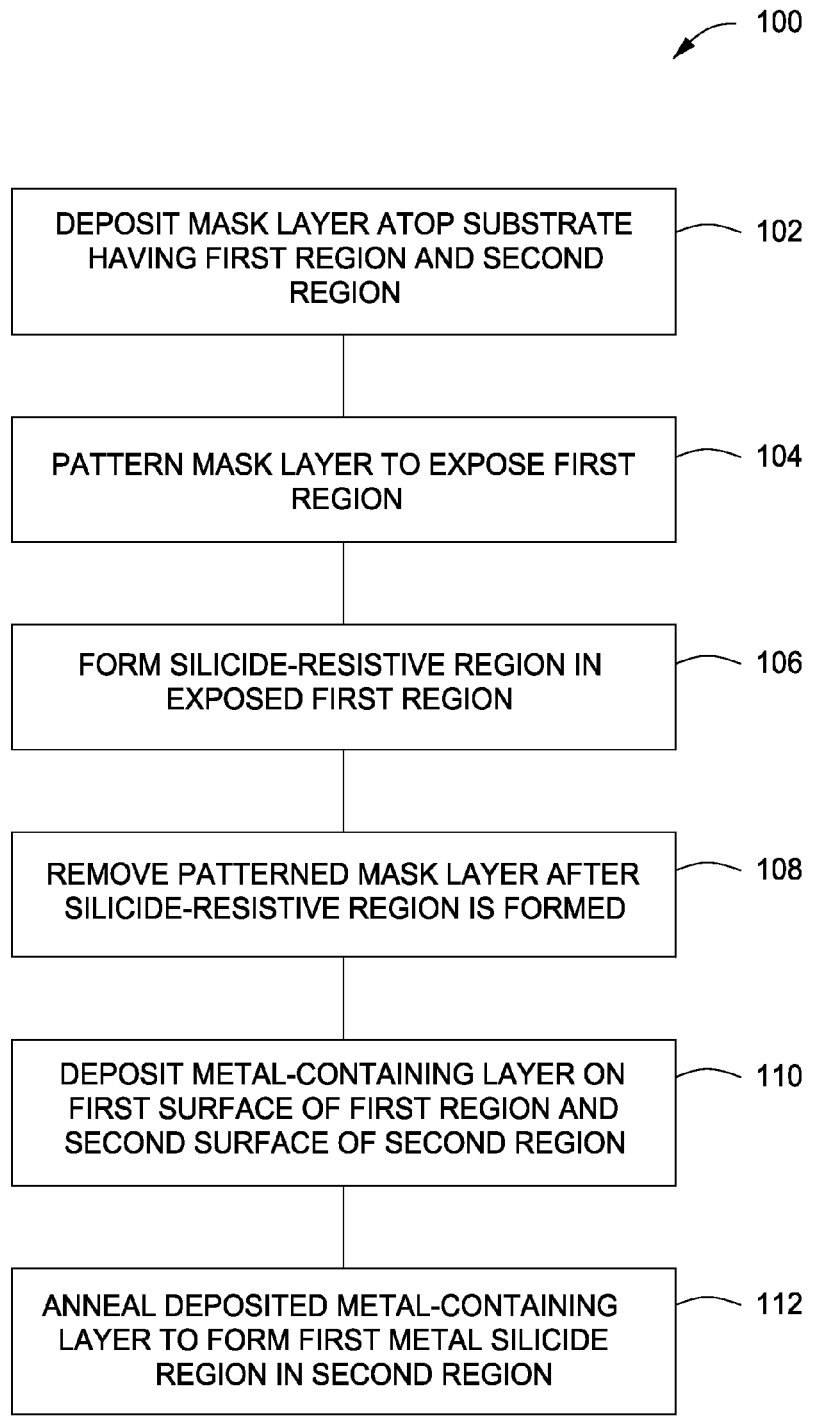
FIG. 1 depicts a flow chart for a method of forming a metal silicide region in an integrated circuit in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods for forming metal silicide regions in integrated circuits are disclosed herein. The inventive methods may advantageously reduce the number and/or complexity of process steps required to form a metal silicide region in an integrated circuit. For example, the use of a silicide-resistive region may eliminate the need for a hard mask layer, such as silicon nitride (SiN) hard mask layer or the like in the fabrication process. Further, the inventive methods may advantageously be used to control the resistivity in resistive layers of the integrated circuit. For example, doping with active dopants such as boron (B), phosphorus (P), or arsenic (As) may be used to control resistivity. For example, resistivities may be controlled to range from about 0.1 to about 10 kohms per square in the absence of silicide formation and may be as low as about 20 ohms per square when a silicide is formed. Accordingly, embodiments of the present invention may provide additional resistivity control mechanisms.

Some integrated circuits may require the formation of low resistivity silicides in the transistor structures as well as high resistivity passive resistor structures. FIG. 1 depicts a flow chart for a method 100 of forming a metal silicide region in an integrated circuit. The method 100 is described below in accordance with a series of fabrication steps illustrated in FIGS. 2A-G and 3A-C. In some embodiments, at least some portions of the method 100 may be performed in a toroidal source plasma ion immersion implantation reactor, for example, such as the reactor 400 described below with respect to FIG. 4 (although other suitable process chambers may alternatively be used).

Figure 2A:
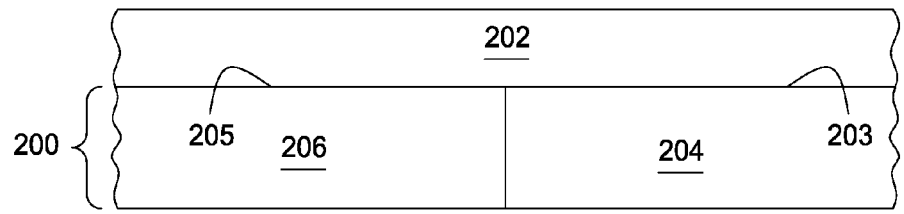
FIGS. 2A-G respectively depict the stages of fabrication of a metal silicide region in a region of a substrate in accordance with some embodiments of the present invention.

The method 100 generally begins at 102 where a mask layer 202 may be deposited atop a substrate 200 having a first region 204 and a second region 206, as illustrated in FIG. 2A. For example, the first region 204 may correspond to a silicon-based resistor of an integrated circuit and the second region 206 may correspond to a transistor region of the integrated circuit. However, the first and second regions 204, 206 are not limited to resistor and transistor regions, respectively, as discussed above. For example, the first region 204 may correspond to a capacitor region, an interconnect structure or the like. The inventive method 100 may be applied to the formation of interconnect structures, such as through silicon via (TSV) applications, micro-electro-mechanical-systems (MEMS) technologies, or the like.

The first region 204 has a first surface 203 and the second region 206 has a second surface 205 on which the mask layer 202 may be deposited. The substrate 200 may be any suitable substrate, such as a silicon substrate, a III-V compound substrate, a silicon germanium (SiGe) substrate, an epi substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 200 may be a semiconductor wafer (e.g., a 200 mm, 300 mm, or the like silicon wafer). In some embodiments, the first region 204 and the second region 206 comprise silicon. In some embodiments, the mask layer 202 may be a photoresist. Exemplary photoresists may include photoresists formed from one or more of poly(methyl methacrylate) (PMMA), poly(methyl glutarimide) (PMGI), phenol formaldehyde resin (DNQ/novolac) or the like.

Figure 2B:
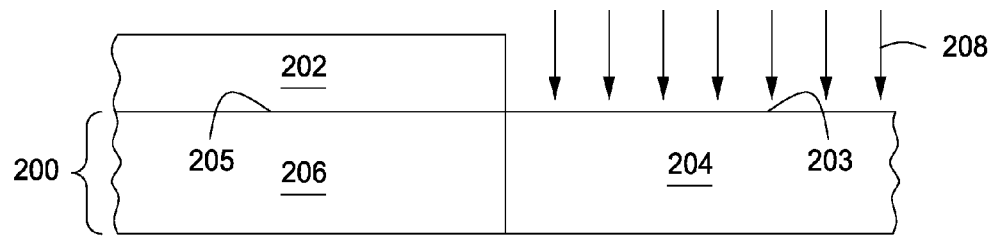
Figure 2C:
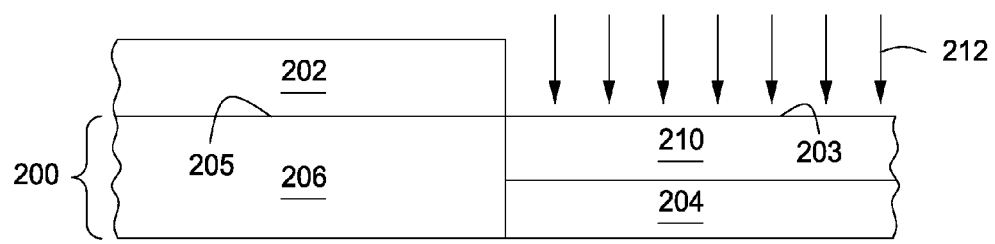
Figure 2D:
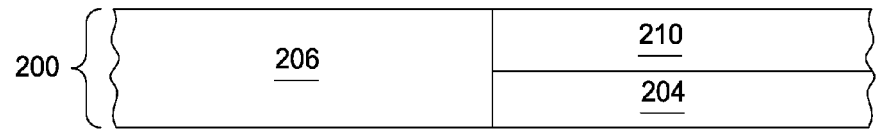

At 104, the mask layer 202 may be patterned to expose the first region 204 of the substrate 200. For example, as illustrated in FIG. 2B, once patterning of the mask layer 202 is complete, the first region 204 may be exposed while the second region 206 remains covered by the mask layer 202. The patterning of the mask layer 202 may be done by any suitable method of patterning such as lithography, etching, or the like. For example, where the mask layer 202 comprises photoresist, optical lithography techniques may be used to expose the portion of the mask layer 202 above the first region 204, followed by development of the mask layer 202 to remove the exposed portion of the mask layer 202 above the first region 204.

In some embodiments, optionally, a dopant may be provided to the exposed first region 204 to control the resistivity of the first region 204, as illustrated by arrows 208. The dopant may be implanted in the first region 204 using the reactor 400 or any suitable dopant implantation method, such as Beam-line implantation, or the like. In some embodiments, the dopant may comprise one or more of boron (B), phosphorus (P), or arsenic (As). In some embodiments, the dopant concentration in the first region may range from about $1\times10^{17}$ $cm^{-3}$ to about $1\times10^{21}$ $cm^{-3}$. For example, increasing the dopant concentration may lower the resistivity in the first region 204. In some embodiments, an anneal may be performed to activate the implanted dopants prior to forming a silicide-resistive region in the exposed first region 204, as discussed below. The anneal to activate the dopants in the exposed first region 204 may be performed at a temperature of about 800 to about 1200 degrees Celsius for a desired period of time, such as about 0.1 to about 60 seconds. In some embodiments, the anneal may be performed in an inert atmosphere, such as an atmosphere including nitrogen ($N_2$), argon (Ar), or the like.

At 106, a silicide-resistive region 210 may be formed in the first region 204 of the substrate 200. For example, the silicide-resistive region 210 may extend into the first region 204 from the first surface 203 of the first region 204. In some embodiments, the silicide-resistive region 210 may extend to a depth of about 10 to about 100 angstroms. The silicide-resistive region 210 may comprise silicon (Si) and at least one of carbon (C) or nitrogen (N). For example, silicon (Si) in the silicide-resistive region 210 may originate from the first region 204 of the substrate 200, whereas the at least one of carbon (C) or nitrogen (N) may be provided to the first region 204. In some embodiments, the silicide-resistive region 210 may be further utilized to control the resistivity of the first region 204. In some embodiments, the silicide-resistive region 210 may be used to control the resistivity of the first region 204 to be lower than what doping alone can achieve (for example, as described above). For example, control of the resistivity of the first region 204 using the silicide-resistive region 210 may be achieved by controlling the concentration and/or depth of the silicide-resistive region 210 extending into the first region 204 from the first surface 203. For example, controlling the concentration and/or depth of the silicide-resistive region 210 may control the amount of metal silicide subsequently formed in the first region 204 in a later process described below. The amount of metal silicide formed in the first region 204 may control the resistivity of the first region 204.

In some embodiments, a source element comprising at least one of carbon (C) or nitrogen (N) may be provided to the first region 204 to form the silicide-resistive region 210. In some embodiments, ions of the source element may be implanted (illustrated by arrows 212 in FIG. 2C) into the first surface 203 of the first region 204. For example, implantation of ions of the source element may be performed using the reactor 400 discussed below. In some embodiments, a concentration of the source element in the silicide-resistive region 210 may be about 0.01 to about 10 atomic percent.

Figure 3A:
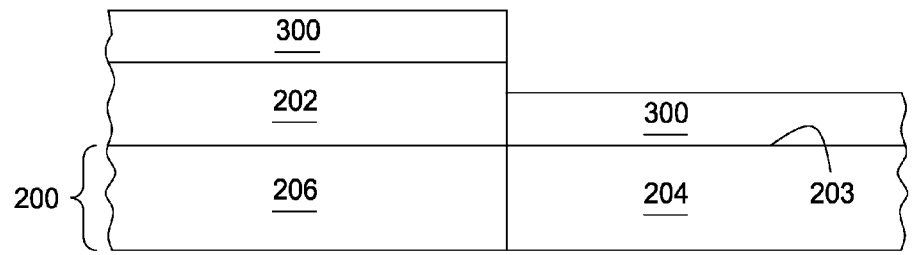
FIGS. 3A-C respectively depict the stages of fabrication of a silicide-resistive region in a region of a substrate in accordance with some embodiments of the present invention.
Figure 3B:
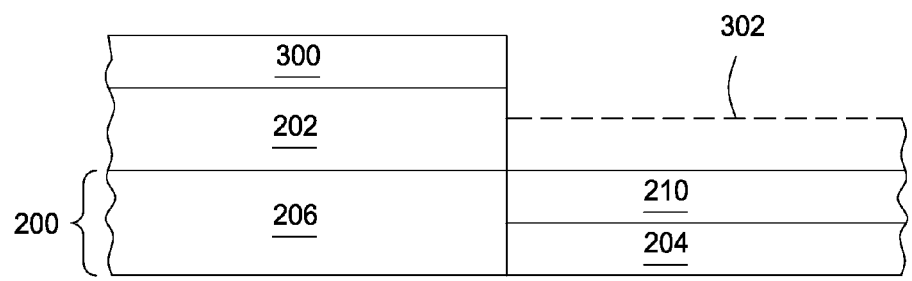
Figure 3C:
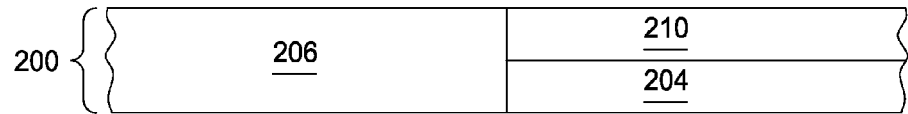

Alternative to an implantation method, the source element may be deposited to form the silicide-resistive region 210 as illustrated in FIGS. 3A-C. For example, a source element-containing layer 300 may be deposited atop the first surface 203 of the first region 204 and atop the mask layer 202 remaining above the second region 206 after the mask layer 202 has been patterned at 104, as depicted in FIG. 3A. For example, the source element-containing layer may include at least one of carbon (C) or nitrogen (N), and optionally, hydrogen (H). In some embodiments, the source element-containing layer may be one or more of a hydrocarbon non-volatile element-containing hydride, or the like. The source element-containing layer may be deposited using the reactor 400 discussed below, for example using a deposition mode. The source element-containing layer may range in thickness from about 10 to about 200 angstroms.

The source-element containing layer 300 may be annealed to form the silicide-resistive region 210 in the first region 204 of the substrate 200. The anneal to form the silicide-resistive region 210 from the source element-containing layer 300 may be performed at a temperature ranging of about 800 to about 1200 degrees Celsius for a desired period of time, such as about 0.1 to about 60 seconds. In some embodiments, the anneal may be performed in an inert atmosphere, such as an atmosphere including nitrogen ($N_2$), argon (Ar), or the like.

In some embodiments, unreacted materials 302 from the source element—containing layer 300 may remain after the anneal to form the silicide-resistive region 210 is complete, as depicted in FIG. 3B. For example, the unreacted materials 302 may be removed with patterned mask layer 202 or separately from the patterned mask layer 202, as depicted in FIG. 3C. For example, the patterned mask layer 202 and unreacted materials 302 may be removed by any suitable methods, such as sulfuric acid ($H_2SO_4$) and hydrogen peroxide ($H_2O_2$) mixture, oxygen plasma treatment or the like.

Returning to FIG. 2D (and also illustrated in FIG. 3C), at 108, after the silicide-resistive region 210 has been formed in the first region 204, the patterned mask layer 202 may be removed. The patterned mask layer 202 may be removed by any of the methods discussed above.

Figure 2E:
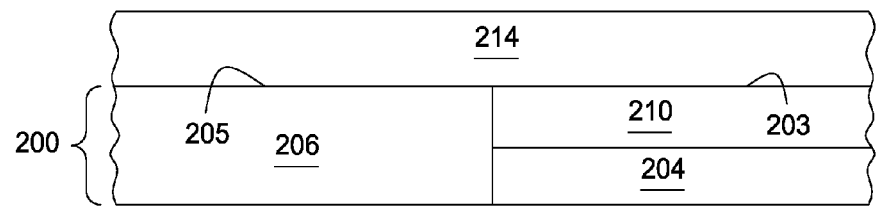

At 110, a metal-containing layer 214 may be deposited on the first surface 203 of the first region 204 and on the second surface 205 of the second region 206 of the substrate 200 as depicted in FIG. 2E. The metal-containing layer 214 may be deposited by any suitable methods, such as physical vapor deposition (PVD), chemical vapor deposition (CVD), atomic layer deposition (ALD), or the like. The metal-containing layer may include one or more of cobalt (Co), titanium (Ti), nickel (Ni), or alloys thereof, such as a nickel-platinum (Ni—Pt) alloy, for example, having a platinum concentration of about 5 to about 20 percent. The metal-containing layer 214 may be deposited to any desired thickness. For example, the thickness of the deposited metal-containing layer 214 may range from about 40 to about 200 angstroms. The thickness of the metal-containing layer 214 may at least partially determine a thickness of a metal-silicide region formed in the second region 206 and, optionally, in the first region 204 as discussed below.

Figure 2F:
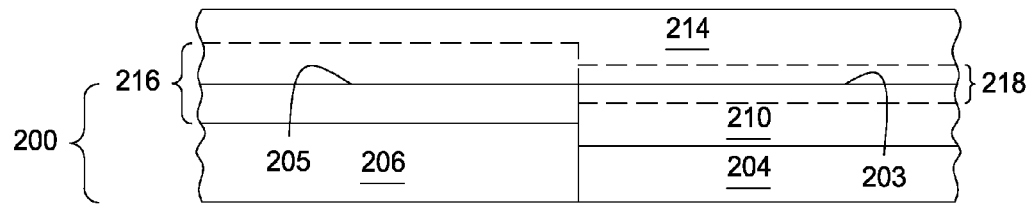

At 112, the deposited metal-containing layer 214 may be annealed to form a first metal silicide region 216 in the second region 206 of the substrate 200, as depicted in FIG. 2F. For example, the anneal to form the first metal silicide region 216 from the metal-containing layer 214 may be performed at a temperature ranging from about 150 to about 450 degrees Celsius for a desired period of time, such as about 5 to about 300 seconds. In some embodiments, the anneal may be performed in an inert atmosphere, such as an atmosphere including nitrogen ($N_2$), argon (Ar), or the like.

Figure 2G:
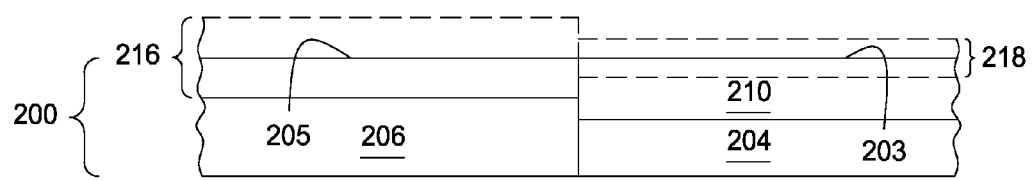

The first metal silicide region 216 as depicted in FIG. 2G may extend into the second region 206 from the second surface 205 and optionally, as illustrated by dotted line, above the second surface 205. The thickness of the first metal silicide region 216 may be controlled by one or more of the thickness and composition of the metal-containing layer 214, the composition of the second region 206, such as identity and concentration of elements in the second region, the orientation of the second surface, such as a specified crystal plane, polycrystalline surface or the like, the temperature of the anneal, the time of the anneal, or the like.

Optionally, a second metal silicide region 218 may be formed in the first region 204. For example, low sheet resistivities, for example, ranging from about 20 Ohm per square to about 500 Ohm per square may be difficult to achieve by dopants alone. Accordingly, the second metal silicide region 218 may be used to tailor the resistivity of the first region 204 to achieve lower resistivities than what may be possible by dopants alone. For example, the second metal silicide region 218 may extend into the silicide-resistive region 210 of the first region 204 and optionally, above the first surface 203 as illustrated in FIG. 2F. For example, the second metal silicide region 218 may be thinner than the first metal silicide region 216 due to the presence of the silicide-resistive region 210. For example, similar factors as those discussed above for controlling the thickness of the first metal silicide region 216 may also be used to control the thickness of the second metal silicide region 218. However, alternatively, or in combination with those factors, the amount of metal silicide formed in the first region 204 may be further controlled by controlling at least one of a concentration of the source element in the silicide-resistive region 210 or a depth that the silicide-resistive region 210 extends into the first region 204 from the first surface 203. For example, increasing the concentration of the source element in the silicide-resistive region 210 may reduce the size of the second metal silicide region 218 formed in the first region 204. For example, increasing the depth that the silicide-resistive region 210 extends into the first region 204 from the first surface 203 may reduce the size of the second metal silicide region 218 formed in the first region 204. In some embodiments, no metal silicide forms in the first region 204 upon annealing of the metal-containing layer 214 (e.g., no second metal silicide region 218 is formed). As discussed above, the amount of metal silicide formed in the first region 204 may at least partially determine resistivity in the first region 204.

After the first metal silicide region 216 (and optionally, the second metal silicide region 218) is formed, non-silicided metal remaining from the depositing the metal containing layer 214 may be removed from the above the first and second regions 204, 206, as depicted in FIG. 2G. For example, when using nickel and nickel alloys as the metal containing layer 214, the non-silicided metal may be removed by applying a wet chemical treatment. The wet chemical treatment may include at least one of hydrochloric acid (HCl), nitric acid ($HNO_3$), sulfuric acid ($H_2SO_4$), hydrogen peroxide ($H_2O_2$) or mixtures thereof to remove at least some of the non-silicided material.

The inventive methods discussed herein may eliminate several processing steps in a standard flow used to mask resistors through the silicidation process. For example, as discussed above a single mask layer may be used in the inventive process flow, whereas conventional methods require a first mask layer to provide dopants to a resistive region of the integrated circuit and then a second mask layer to provide a metal silicide to the transistor region of the integrated circuit. In some embodiments, results show proper carbon dose and implant energy can result in an increase in resistivity in the first region of greater than 10 times after silicide formation steps as compared to non-implanted areas using conventional formation methods.

Embodiments of the present invention may be performed in toroidal source plasma ion immersion implantation reactor such as, but not limited to, the CONFORMA™ reactor commercially available from Applied Materials, Inc., of Santa Clara, Calif. Such a suitable reactor and its method of operation are set forth in U.S. Pat. No. 7,166,524, assigned to the assignee of the present invention.

Figure 4:
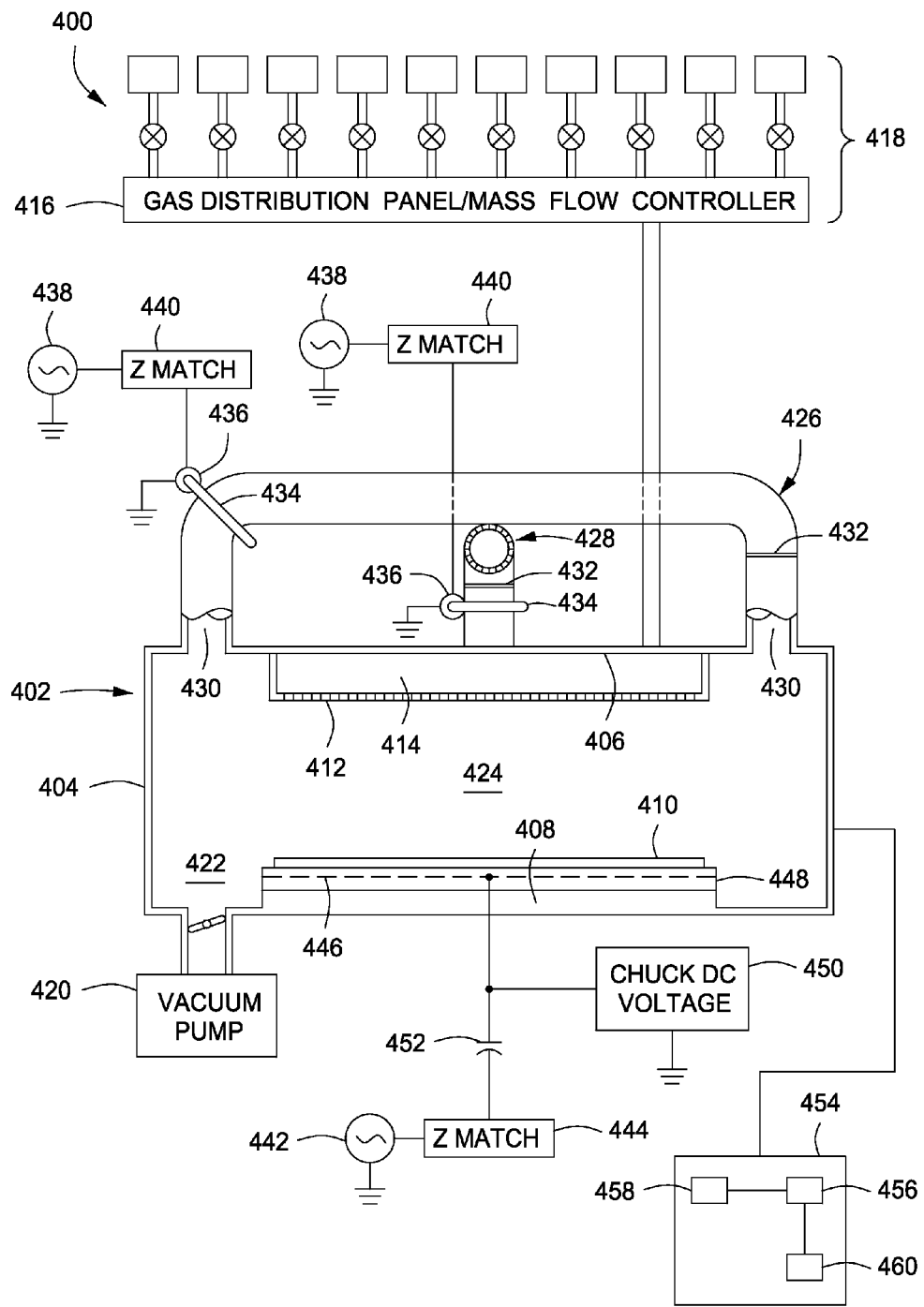
FIG. 4 depicts a schematic view of a plasma immersion ion implantation process chamber in accordance with some embodiments of the present invention.

Referring to FIG. 4, a toroidal source plasma immersion ion implantation reactor 400 of the type disclosed in the above-reference application has a cylindrical vacuum chamber 402 defined by a cylindrical side wall 404 and a disk-shaped ceiling 406. A substrate support pedestal 408 at the floor of the chamber supports a substrate 410 (e.g., substrate 200) to be processed. A gas distribution plate or showerhead 412 on the ceiling 406 receives process gas in its gas manifold 414 from a gas distribution panel 416 whose gas output can be any one of or mixtures of gases from one or more individual gas supplies 418. A vacuum pump 420 is coupled to a pumping annulus 422 defined between the substrate support pedestal 408 and the sidewall 404. A processing region 424 is defined between the substrate 410 and the gas distribution plate 412.

Pair of external reentrant conduits 426, 428 establishes reentrant toroidal paths for plasma currents passing through the processing region 424, the toroidal paths intersecting in the processing region 424. Each of the conduits 426, 428 has a pair of ends 430 coupled to opposite sides of the chamber. Each conduit 426, 428 is a hollow conductive tube. Each conduit 426, 428 has a D.C. insulation ring 432 preventing the formation of a closed loop conductive path between the two ends of the conduit.

An annular portion of each conduit 426, 428, is surrounded by an annular magnetic core 434. An excitation coil 436 surrounding the core 434 is coupled to an RF power source 438 through an impedance match device 440. The two RF power sources 438 coupled to respective ones of the coils 436 may be of two slightly different frequencies. The RF power coupled from the RF power generators 438 produces plasma ion currents in closed toroidal paths extending through the respective conduit 426, 428 and through the processing region 424. These ion currents oscillate at the frequency of the respective RF power source 438. Bias power is applied to the substrate support pedestal 408 by a bias power generator 442 through an impedance match circuit 444.

Plasma formation is performed by introducing a process gas, or mixture of process gases into the chamber 424 through the gas distribution plate 412 and applying sufficient source power from the generators 438 to the reentrant conduits 426, 428 to create toroidal plasma currents in the conduits and in the processing region 424. The plasma flux proximate the wafer surface is determined by the wafer bias voltage applied by the RF bias power generator 442. The plasma rate or flux (number of ions sampling the wafer surface per square cm per second) is determined by the plasma density, which is controlled by the level of RF power applied by the RF source power generators 438. The cumulative ion dose (ions/square cm) at the wafer 410 is determined by both the flux and the total time over which the flux is maintained.

If the wafer support pedestal 408 is an electrostatic chuck, then a buried electrode 446 is provided within an insulating plate 448 of the wafer support pedestal, and the buried electrode 446 is coupled to a user-controllable D.C. chucking voltage supply 450 and to the bias power generator 442 through the impedance match circuit 444 and through an optional isolation capacitor 452 (which may be included in the impedance match circuit 444).

In operation, and for example, the substrate 410 may be placed on the substrate support pedestal 408 and one or more process gases may be introduced into the chamber 402 to strike a plasma from the process gases.

In operation, a plasma may be generated from the process gases within the reactor 400 to selectively modify surfaces of the substrate 410 as discussed above. The plasma is formed in the processing region 424 by applying sufficient source power from the generators 438 to the reentrant conduits 426, 428 to create plasma ion currents in the conduits 426, 428 and in the processing region 424 in accordance with the process described above. In some embodiments, the wafer bias voltage delivered by the RF bias power generator 442 can be adjusted to control the flux of ions to the wafer surface, and possibly one or more of the thickness a layer formed on the wafer or the concentration of plasma species embedded in the wafer surface. In some embodiments, no bias power is applied.

A controller 454 comprises a central processing unit (CPU) 456, a memory 458, and support circuits 460 for the CPU 456 and facilitates control of the components of the chamber 402 and, as such, of the etch process, as discussed below in further detail. To facilitate control of the process chamber 402, for example as described below, the controller 454 may be one of any form of general-purpose computer processor that can be used in an industrial setting for controlling various chambers and sub-processors. The memory 458, or computer-readable medium, of the CPU 1456 may be one or more of readily available memory such as random access memory (RAM), read only memory (ROM), floppy disk, hard disk, or any other form of digital storage, local or remote. The support circuits 460 are coupled to the CPU 456 for supporting the processor in a conventional manner. These circuits include cache, power supplies, clock circuits, input/output circuitry and subsystems, and the like. The inventive methods, or at least portions thereof, described herein may be stored in the memory 458 as a software routine. The software routine may also be stored and/or executed by a second CPU (not shown) that is remotely located from the hardware being controlled by the CPU 456.

Thus, methods for forming metal silicide regions in integrated circuits are disclosed herein. The inventive methods may advantageously reduce the number of process steps required to form a metal silicide region in an integrated circuit. For example, the use of a silicide-resistive region may eliminate the need for a hard mask layer, such as silicon nitride (SiN) hard mask layer or the like in the fabrication process. Further, the inventive methods may advantageously be used to control the resistivity in resistive layers of the integrated circuit. For example, doping with dopants such as boron (B), phosphorus (P), or arsenic (As) may be used to control resistivity; however, lower resistivities, such as submicron device nodes, may be difficult to achieve by dopants alone. Accordingly, the inventive methods may provide an additional resistivity control mechanism.

While the foregoing is directed to embodiments of the present invention, other and further embodiments of the invention may be devised without departing from the basic scope thereof.

The invention claimed is:

1. A method of forming a metal silicide region in an integrated circuit, comprising:
   depositing a mask layer atop a substrate having a first region and a second region;
   patterning the mask layer to expose the first region;
   depositing a source element-containing layer atop a first surface of the first region and annealing the source element-containing layer to form a silicide-resistive region in the first region of the substrate;

removing the mask layer after the silicide-resistive region is formed in the first region of the substrate;

depositing a metal-containing layer on a first surface of the first region and a second surface of the second region; and annealing the deposited metal-containing layer to form a first metal silicide region in the second region and to form either no metal silicide in the first region or a second metal silicide region in the first region that has a thickness less than that of the first metal silicide region.

2. The method of claim 1, further comprising:

after the first metal silicide region is formed in the second region, removing non-silicided metal remaining from depositing the metal-containing layer from above the first and second regions.

3. The method of claim 2, wherein removing the non-silicided metal further comprises:

applying a wet chemical treatment including at least one of hydrochloric acid (HCl), nitric acid ($HNO_3$), sulfuric acid ($H_2SO_4$), or hydrogen peroxide ($H_2O_2$) to remove at least some of the non-silicided metal.

4. The method of claim 1, wherein the silicide-resistive region extends into the first region from the first surface of the first region.

5. The method of claim 4, wherein the silicide-resistive region extends to a depth ranging from about 10 to about 100 angstroms.

6. The method of claim 4, wherein the silicide-resistive region comprises silicon (Si) and at least one of carbon (C) or nitrogen (N).

7. The method of claim 1, wherein the source element comprises at least one of carbon (C) or nitrogen (N).

8. The method of claim 1, wherein forming the silicide-resistive region further comprises:

controlling at least one of a concentration of the source element in the silicide-resistive region or a depth that the silicide-resistive region extends into the first region from the first surface to control the amount of metal silicide formed in the first region.

9. The method of claim 8, wherein increasing the concentration of the source element in the silicide-resistive region reduces the size of a second metal silicide region formed in the first region.

10. The method of claim 9, wherein increasing the depth that the silicide-resistive region extends into the first region from the first surface reduces the size of a second metal silicide region formed in the first region.

11. The method of claim 1, wherein no metal silicide forms in the first region upon annealing the metal-containing layer.

12. The method of claim 1, wherein annealing the deposited metal-containing layer further comprises:

forming a second metal silicide region in the first region, wherein the second metal silicide region is thinner than the first metal silicide region.

13. The method of claim 1, wherein prior to forming the silicide-resistive region, further comprising:

providing a dopant to the exposed first region to control the resistivity of the first region.

14. The method of claim 1, wherein the metal-containing layer comprises one or more of cobalt (Co), titanium (Ti), nickel (Ni), or platinum (Pt).

15. A method of forming a metal silicide region in an integrated circuit, comprising:

forming a silicide-resistive region in a first region of a substrate, the substrate having the first region and a second region, wherein a mask layer is deposited atop the substrate and patterned to expose the first region;

removing the mask layer after the silicide-resistive region is formed in the first region of the substrate;

depositing a metal-containing layer on a first surface of the first region and a second surface of the second region; and annealing the deposited metal-containing layer to form a first metal silicide region in the second region, wherein no metal silicide forms in the first region upon annealing the metal-containing layer.

16. The method of claim 15, wherein forming the silicide-resistive region further comprises:

providing a source element to the first region.

17. The method of claim 16, wherein providing the source element further comprises:

implanting ions of the source element into the first surface of the first region.

18. The method of claim 16, wherein providing the source element further comprises:

depositing a source element-containing layer atop the first surface of the first region; and annealing the source element-containing layer to form the silicide-resistive region.

19. A method of forming a metal silicide region in an integrated circuit, comprising:

depositing a mask layer atop a substrate having a first region and a second region;

patterning the mask layer to expose the first region;

depositing a source element-containing layer atop a first surface of the first region and heating the source element-containing layer to form a silicide-resistive region in the first region of the substrate, wherein the silicide-resistive region comprises silicon (Si) and carbon (C), and wherein the source element-containing layer is heated once to form the silicide-resistive region;

removing the mask layer after the silicide-resistive region is formed in the first region of the substrate;

depositing a metal-containing layer on a first surface of the first region and a second surface of the second region; and annealing the deposited metal-containing layer to form a first metal silicide region in the second region.

* * * * *